United States Patent [19]
Hirai

[11] Patent Number: 6,150,673
[45] Date of Patent: Nov. 21, 2000

[54] LIGHT EMITTING DIODE UNIT FOR DISTANCE MEASURING SYSTEM

[75] Inventor: Isami Hirai, Tokyo, Japan

[73] Assignee: Asahi Kogaku Kogyo Kabushiki Kaisha, Tokyo, Japan

[21] Appl. No.: 09/295,496

[22] Filed: Apr. 21, 1999

[30] Foreign Application Priority Data

Apr. 22, 1998 [JP] Japan ................................. 10-111807
Apr. 22, 1998 [JP] Japan ................................. 10-111965

[51] Int. Cl.$^7$ ................................................ H01L 33/00
[52] U.S. Cl. ................................. 257/98; 257/99; 257/100
[58] Field of Search .............................. 257/79, 98, 99, 257/100, 95; 362/800; 354/403

[56] References Cited

U.S. PATENT DOCUMENTS 4,771,308  9/1988  Tejima et al. ............................ 354/403
4,870,442  9/1989  Tejima et al. ............................ 354/403
4,905,034  2/1990  Tejima et al. ............................ 354/403
4,949,115  8/1990  Tejima et al. ............................ 354/403
5,065,177  11/1991 Yamamoto et al. ..................... 354/403
5,870,637  2/1999  Sensui ..................................... 396/109

*Primary Examiner*—Minh Loan Tran
*Attorney, Agent, or Firm*—Greenblum & Bernstein, P.L.C.

[57] ABSTRACT

A light emitting diode (LED) unit is provided with an LED chip having a light emitting surface; and a transparent body enclosing the LED chip. The transparent body has a reflection surface that is arranged to face the light emitting surface to reflect a light beam emitted by the LED chip, and a light emerging surface that is a surface opposite to the reflection surface. The light beam emitted from the light emitting surface of the LED chip is reflected by the reflection surface, and then emerged from the light emerging surface. At least one of the reflection surface and the light emerging surface is formed to have a positive power so that a converging light beam is emerged from the light emerging surface

15 Claims, 10 Drawing Sheets

LIGHT EMITTING DIODE UNIT FOR DISTANCE MEASURING SYSTEM

BACKGROUND OF THE INVENTION

The present invention relates to a light emitting diode (LED) unit employed in a photographing apparatus having an auto-focusing system.

Conventionally, in an auto-focusing system employing a triangular distance measuring system, a light emitting device as shown in FIG. 9 is employed. The auxiliary light emitting device is arranged, for example, aside from a photographing lens of an auto-focus camera. The light emitting device shown in FIG. 9 is provided with an LED (Light Emitting Diode) unit 1, and a projection lens 3. Infrared light emitted from a light emerging surface 2 of the LED unit 1 is projected towards an object through the projection lens 3. The light reflected by the object is received by a photo sensor accommodated in the camera. Then, depending on the position at which the reflected light is received, a distance to the object is determined.

FIG. 10 shows an another example of the light emitting device, which is used as an auxiliary light emitting device of a camera employing a phase-contrast distance measuring system. In the light emitting device shown in FIG. 10, a predetermined chart 4 is further arranged between the light emerging surface 2 of the LED unit 1 and the projection lens 3. When the LED unit 1 emits light, an image of the chart 4 is formed by the projection lens 3 on a plane at a predetermined position in front of the projection lens 3. The light reflected by an object in front of a camera is received through a photographing lens of the camera, and then the phase-contrast distance measuring method is applied to determine the focusing condition.

In the conventional auxiliary light emitting devices, however, the LED unit 1, the chart 4 (when used) and the projection lens 3 are constituted as separate elements. Therefore, it is difficult to make the auxiliary light emitting device compact, and further, it is troublesome to adjust distances between the elements when they are assembled.

SUMMARY OF THE INVENTION

It is therefore an object of the invention to provide an improved auxiliary light emitting device which can be assembled relatively easily, and can be made compact.

For the above object, according to the present invention, there is provided a light emitting diode (LED) unit which is provided with: an LED chip having a light emitting surface; and a transparent body enclosing the LED chip. The transparent body has a reflection surface that is arranged to face the light emitting surface to reflect a light beam emitted by the LED chip, and a light emerging surface that is a surface opposite to the reflection surface. The light beam emitted from the light emitting surface of the LED chip is reflected by the reflection surface, and then emerged from the light emerging surface. At least one of the reflection surface and the light emerging surface is formed to have a positive power so that a converging light beam is emerged from the light emerging surface.

With this constitution, it becomes unnecessary to adjust the positions between the elements, and further, the LED unit can be made compact. Furthermore, although the positions of the elements need not be adjusted, the elements can be arranged accurately.

When the reflection surface has a positive power, the reflection surface may include a concave reflection surface. While, when the light emerging surface has a positive power, the light emerging surface may include a convex lens surface.

Both the reflection surface and the light emerging surface may have a positive power. In such a case, the reflection surface may include a concave reflection surface, and the light emerging surface may include a convex lens surface.

According to another aspect of the invention, there is provided a light emitting diode (LED) unit which is provided with: an LED chip having a light emitting surface; and a transparent body enclosing the LED chip. The transparent body has a reflection surface that is arranged to face the light emitting surface to reflect a light beam emitted by the LED chip, and a light emerging surface that is a surface opposite to the reflection surface. The light beam emitted from the light emitting surface of the LED chip is reflected by the reflection surface, and then emerged from the light emerging surface. The LED unit is provided with a chart having a predetermined pattern, and the light beam emerged from the light emerging surface forms an image of the predetermined pattern on an objective surface.

The chart may be provided on the light emitting surface of the LED chip. Preferably, the chart includes an electrode attached on the light emitting surface of the LED chip.

In this case, at least one of the reflection surface and the light emerging surface may be formed to have a positive power.

In particular, the reflection surface may include a concave reflection surface, and a normal to the light emitting surface of the LED chip may be inclined with respect to a plane perpendicular to an optical axis of the concave reflection surface. It should be noted that the optical axis is defined as a normal to the reflection surface at the center thereof.

Alternatively, the light emerging surface may include a convex lens surface, and a normal to the light emitting surface of the LED chip may be inclined with respect to a plane perpendicular to an optical axis of the convex lens surface (i.e., a normal to the convex surface at the center thereof).

The chart having the predetermined pattern can also be arranged in the vicinity of the light emerging surface, and the LED unit further includes a projection lens for forming an image of the predetermined pattern on an objective surface.

Preferably, the reflection surface may have a concave reflection surface. Further preferably, the chart and the light emitting surface of the LED chip are conjugate with respect to the concave reflection surface.

Optionally, the light emerging surface and the chart may be inclined with respect to a plane perpendicular to an optical axis of the projection lens. In this case, the light beam emerged from the light emerging surface may proceed along the optical axis of the projection lens.

DESCRIPTION OF THE ACCOMPANYING DRAWINGS

DESCRIPTION OF THE EMBODIMENTS

[First Embodiment]

Figure 1:
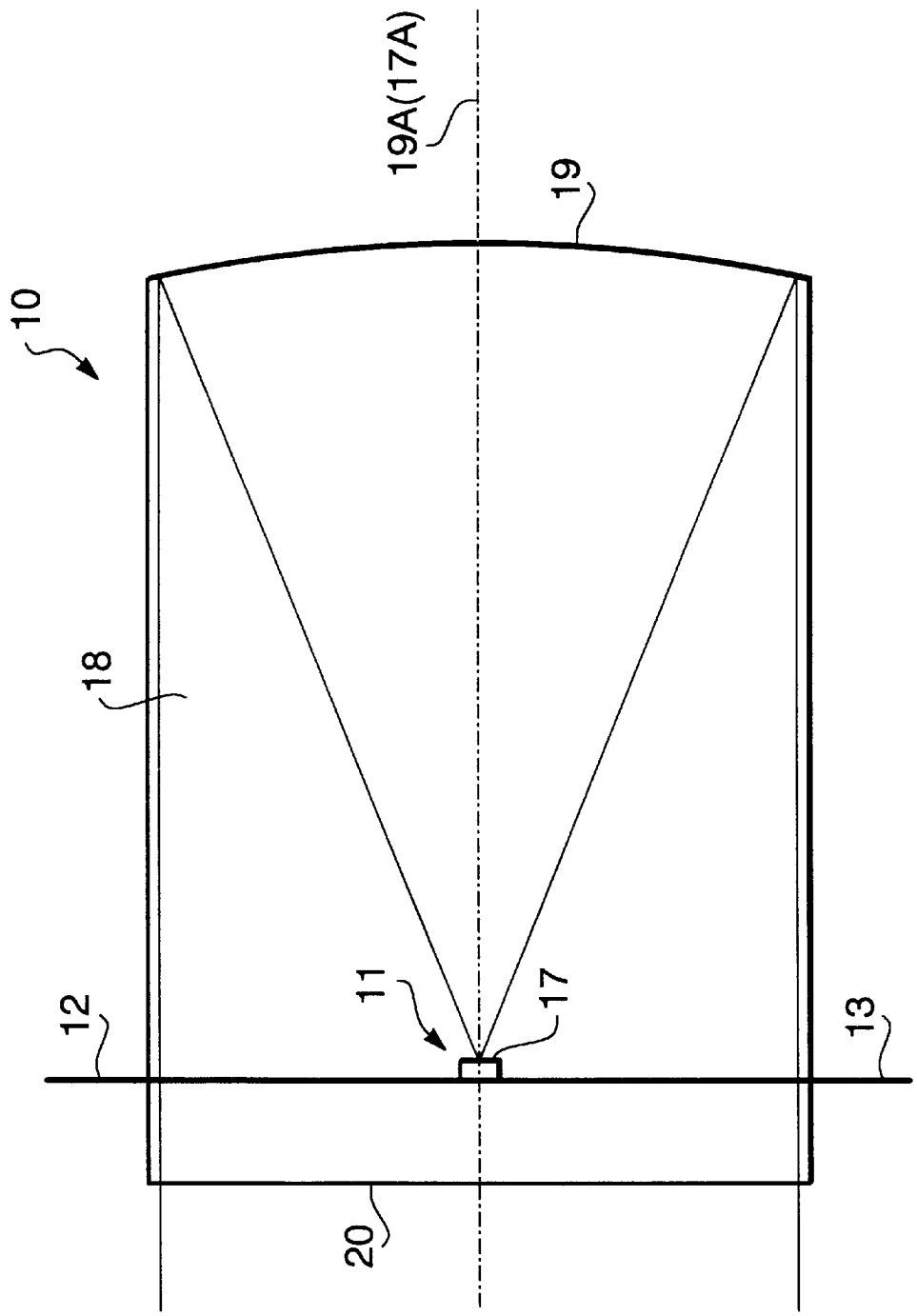
FIG. 1 is a cross sectional view of an LED (Light Emitting Diode) unit according to a first embodiment of the invention.

FIG. 1 is a cross sectional view of an LED (Light Emitting Diode) unit 10 according to a first embodiment of the invention. The LED unit 10 has constituted such that an LED chip 11 is enclosed in a transparent acrylic resin body 18.

Figure 6:
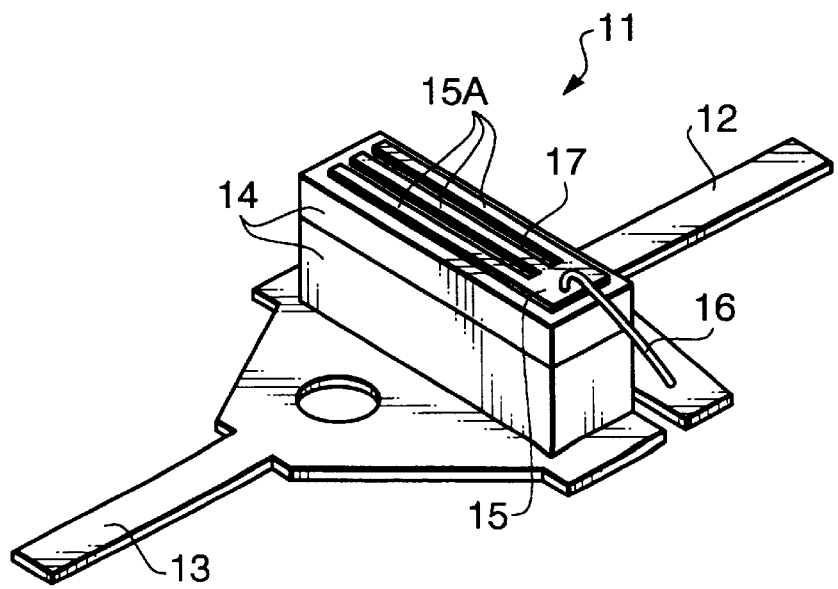
FIG. 6 is a perspective view of the LED chip employed in the first through fifth embodiments.

FIG. 6 is a perspective view of the LED chip 11 enclosed in the LED unit 10. The LED chip 11 includes a positive terminal 12, a negative terminal 13, a PN semiconductor 14, an electrode 15, a wire 16 which electrically connects the positive terminal 12 and the electrode 15.

The PN semiconductor 14 is mounted on the negative terminal 13, and the electrode 15 is mounted on a light emitting surface 17 of the PN semiconductor 14. A predetermined pattern 15A is formed on the electrode 15 by forming a plurality of slits on the electrode 15, and a light beam emitted by the LED chip 11 passes through the slits (i.e., the pattern 15A) to form an image thereof. The light emitting surface 17 of the PN semiconductor 14 is formed to be a planar surface.

The acrylic resin body 18 has a light reflection surface 19 which faces the light emitting surface 17 of the LED chip 11. Another surface 20 located opposite to the reflection surface 19 is formed to be a light emerging surface 20 from which a light beam emitted by the LED chip 11 and reflected by the light reflection surface 19 is emerged. On the reflection surface 19, reflective coating of aluminum or the like is formed by evaporation. The reflection surface 19 is formed to be a concave surface having positive power, while the emerging surface 20 is formed to be a planar surface.

In the LED unit 10, the normal 17A to the emerging surface 20 at the center thereof and the optical axis 19A of the reflection surface 19 coincide with each other. The light beam emitted from the light emitting surface 17 and passed through the slits of the electrode 15 is reflected by the reflection surface 19 and emerged from the emerging surface 20. The light emerged from the emerging surface 20 is converged at a position at a predetermined distance (e.g., 2–3 meters) in front of the emerging surface 20.

Thus, the comb-like (stripe pattern) image of the chart (i.e., the pattern 15A) is formed at a predetermined position in front of the emerging surface 20. Even if an object has a relatively low contrast, the image of the pattern 15A is formed on the object, and accordingly, a focusing condition can be detected and adjusted using the image of the pattern 15A formed on the object.

In the first embodiment, the positive terminal 12 and the negative terminal 13 extend in parallel with the emerging surface 20. With this structure, the LED unit 10 can easily be formed with molding process since the terminals 12 and 13 can be arranged along the parting-line (PL) surface of the mold.

Figure 12:
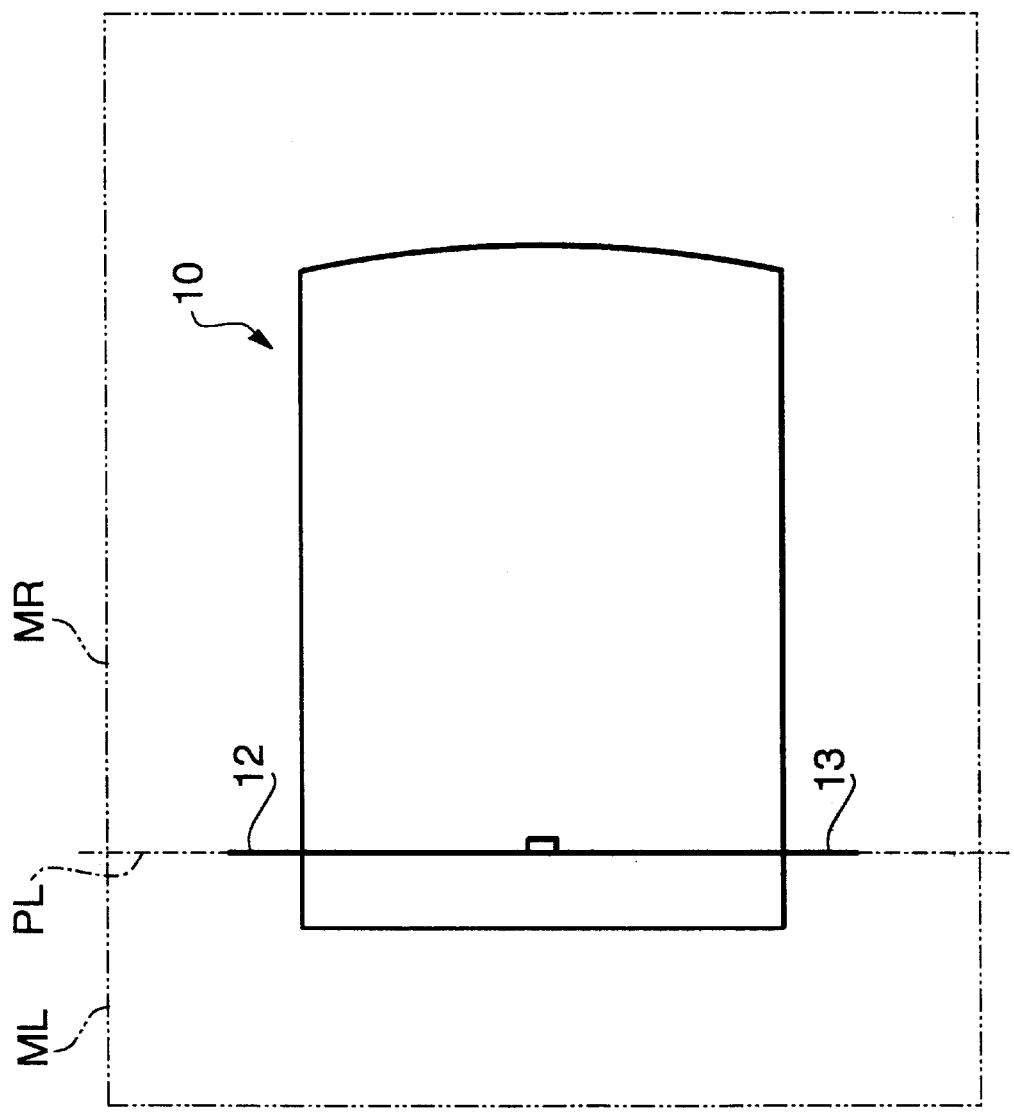
FIG. 12 schematically shows an example of a mold which is divided into two parts at electrical terminals of the LED unit.

That is, the mold may be divided into two parts MR and ML, which are apart at a plane including the terminal 12 and 13 (see FIG. 12).

In the above structure, if, instead of using a comb-like pattern, an aperture member is provided and the LED chip 31 is constituted to emit infrared light, the LED unit can be used as a light source of a distance measuring unit using a triangular distance measuring method.

[Second Embodiment]

Figure 2:
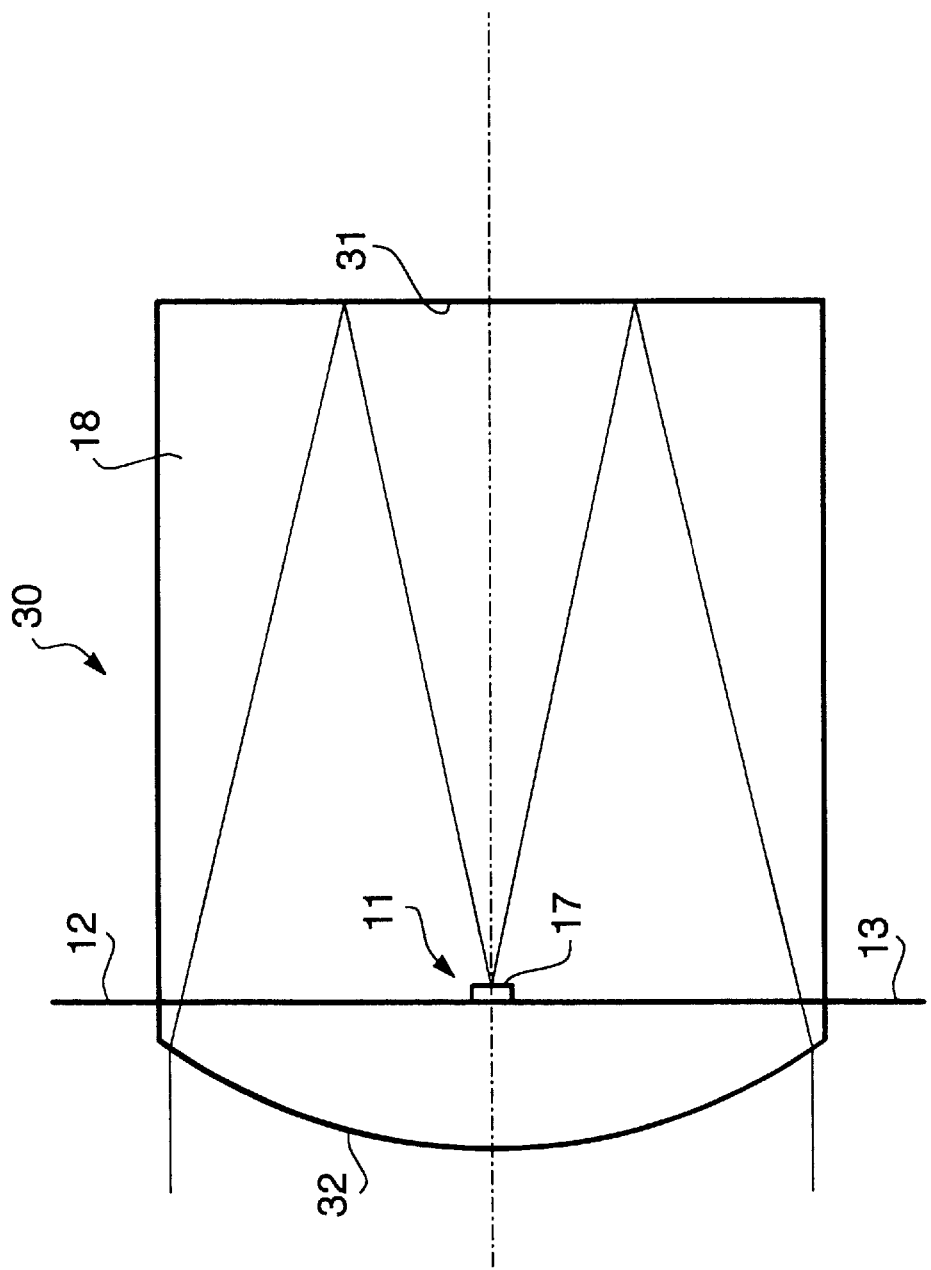
FIG. 2 is a cross sectional view of an LED unit according to a second embodiment of the invention.

FIG. 2 is across sectional view of an LED unit 30 according to a second embodiment of the invention.

The LED unit 30 has a similar structure as the first embodiment except that the LED unit 30 has a reflection surface 31 which is a planar surface, and a light emerging surface 32 which is a convex surface having positive power. Power of the convex surface 32 (which is a refraction surface) is configured such that the image of the pattern is formed on a plane located at a predetermined position in front of the light emerging surface 32.

[Third Embodiment]

Figure 3:
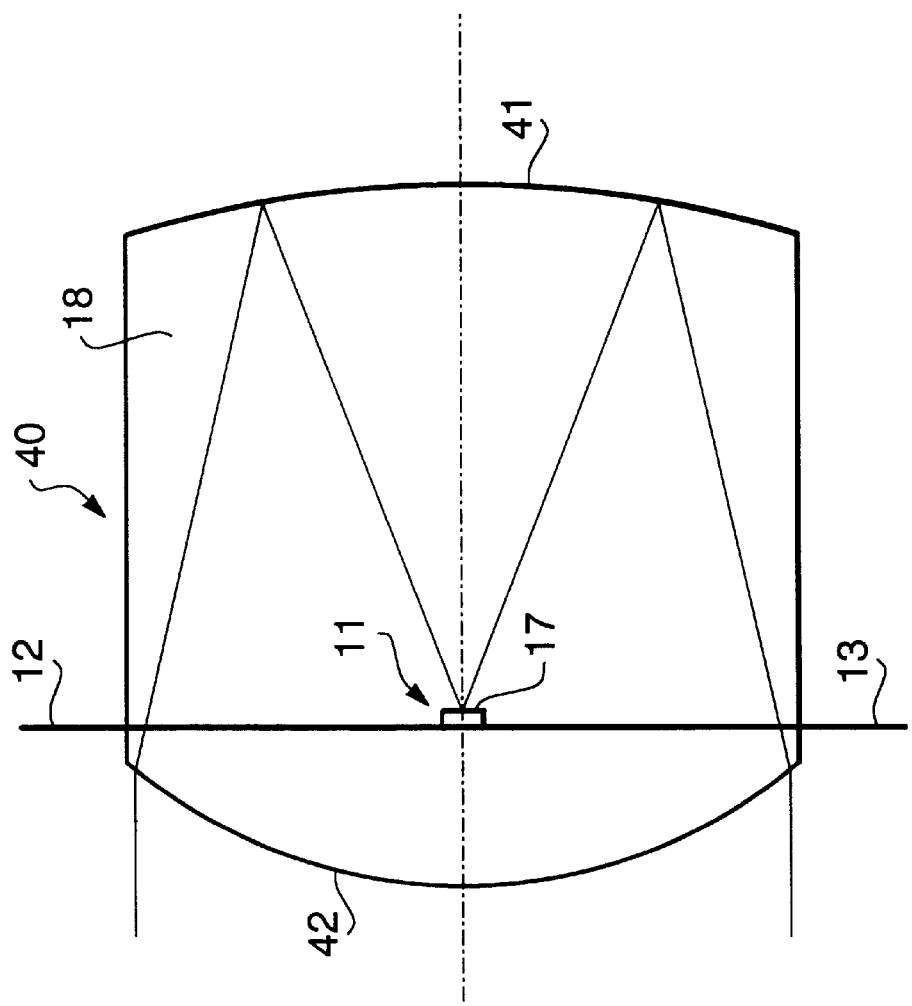
FIG. 3 is a cross sectional view of an LED unit according to a third embodiment of the invention.

FIG. 3 is a cross sectional view of an LED unit 40 according to a third embodiment of the invention.

The LED unit 40 has a reflection surface 41 which is a concave surface having positive power, and a light emerging surface 42 which is a convex surface having positive power. Power of the concave reflection surface 41 and the convex surface 42 is configured such that the image of the pattern is formed on a plane located at a predetermined position in front of the light emerging surface 42. Constitution of the LED unit 40 other than the above is similar to that of the first embodiment.

According to the LED unit 40, the length in the direction of the optical axis can be shortened, and attenuation of the light amount passed through the acrylic resin can be reduced. Therefore, the emitted light may reach a farther object.

[Fourth Embodiment]

Figure 4:
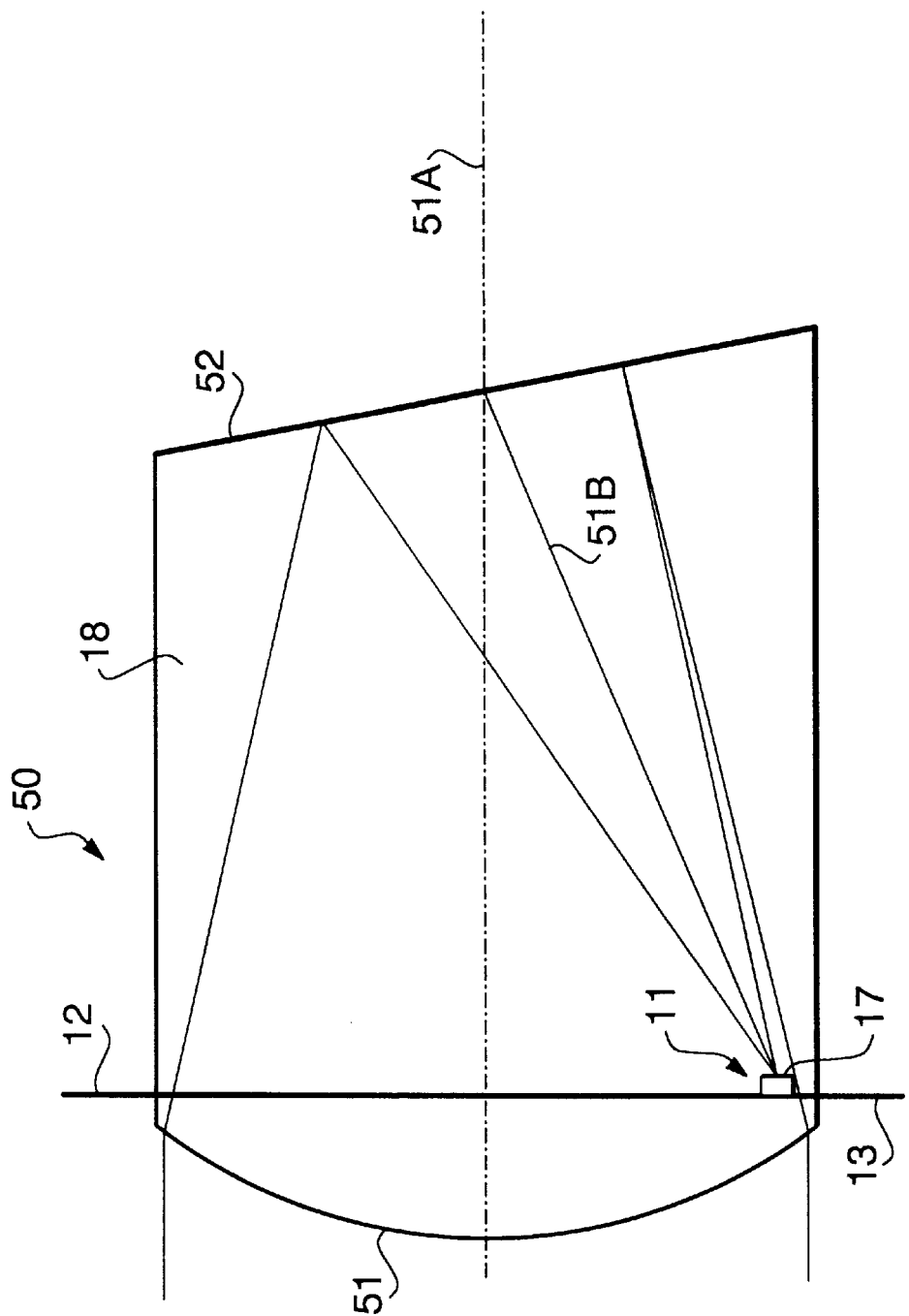
FIG. 4 is a cross sectional view of an LED unit according to a fourth embodiment of the invention.

FIG. 4 is a cross sectional view of an LED unit 50 according to a fourth embodiment of the invention.

In the LED unit 50, a light reflection surface 52 is a planar surface, and a light emerging surface 51 is a convex surface. The light reflection surface 52 is inclined with respect to a light emitting surface 17 of the LED chip 11.

As shown in FIG. 4, the light emitting surface 17 of the LED chip 11 and the electrode 15 mounted thereon are located away from the optical axis 51A of the convex surface. It should be noted that, in this embodiment, the optical axis 51A is defined as a normal to the surface 51 at the center thereof. The position of the LED chip 11 and the inclination of the reflection surface 52 are determined such that a ray of light emitted by the LED 11 and incident on a point where the optical axis 51A intersects the reflection surface 52 proceeds along the optical axis 51A. The normal to the light emitting surface 17 is in parallel with the optical axis 51A. Thus, the pattern 15A on the light emitting surface 17 inclines with respect to a plane perpendicular to the optical axis.

With this constitution, the pattern 15A inclines with respect to a plane perpendicular to the optical axis 51A, the image plane of the pattern 15A is also inclined with respect to a plane perpendicular to the optical axis 51A. Thus, in accordance with the Scheimpflug rule, the image of the pattern 15A is projected over a relatively wide distance range. Accordingly, the measurable distance range can be enhanced.

In the fourth embodiment, the positive terminal 12 and the negative terminal 13 extend substantially in parallel with the emerging surface 51. With this structure, the LED unit 50 can easily be formed with molding process since the terminals 12 and 13 can be arranged along the PL surface of the mold.

The fourth embodiment can be modified such that the reflection surface 52 is formed to be a concave surface.

[Fifth Embodiment]

Figure 5:
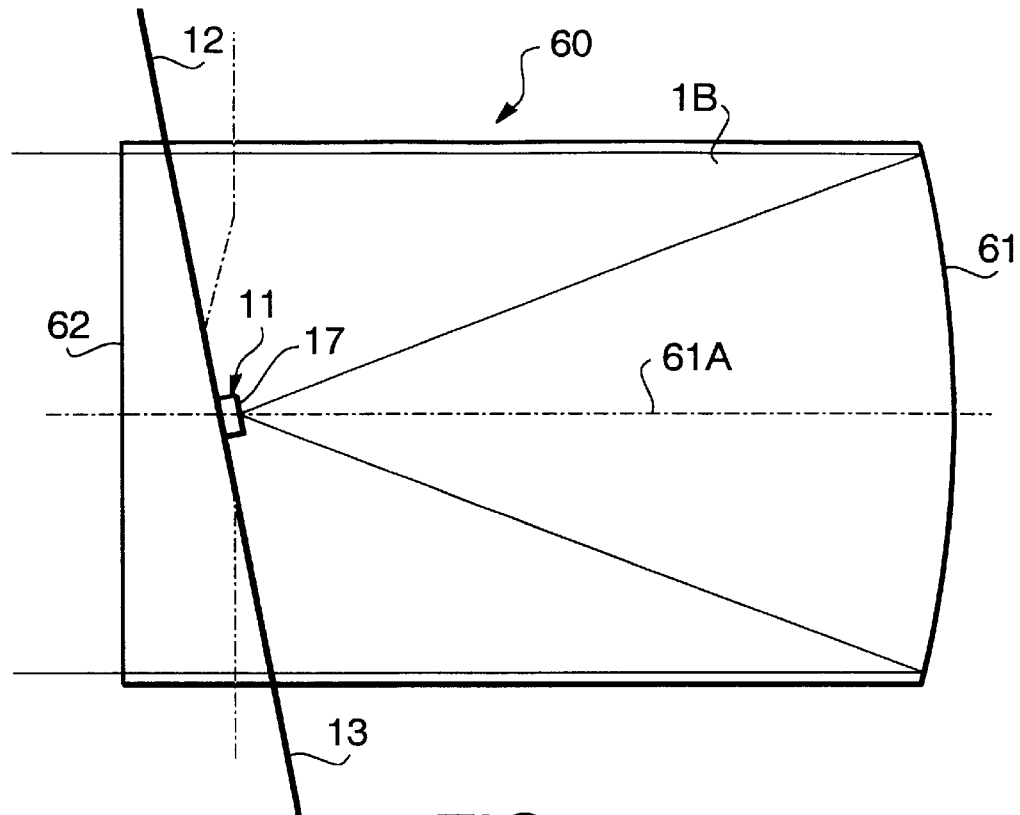
FIG. 5 is a cross sectional view of an LED unit according to a fifth embodiment of the invention.

FIG. 5 is a cross sectional view of an LED unit 60 according to a fifth embodiment of the invention.

The LED unit 60 has a reflection surface 61 which is a concave surface, and faces the light emitting surface 17 of the LED chip 11, and a light emerging surface 62 which is a planar surface. In the fifth embodiment, the light emitting surface 17 is provided on an optical axis 61A of the reflection surface 61, however, the normal to the light emitting surface 17 is inclined with respect to the optical axis 61A. Thus, the pattern 16A formed on the light emitting surface 17 is inclined with respect to a plane perpendicular to the optical axis 61A. When light is converged in front of the emerging surface 62, according to the -Scheimpflug rule, the image plane inclines with respect to a plane perpendicular to the optical axis 61A, and accordingly, measurable distance range is widened.

According to the fifth embodiment, the terminals 12 and 13 do not extend in parallel with the emerging surface 62. If the terminals 12 and 13 are bent at midst portions thereof so as to be parallel with the emerging surface 62, opening direction of the mold can be set similarly to the first embodiment. Such a modification is convenient for multiple-impression molding.

[Sixth Embodiment]

Figure 7:
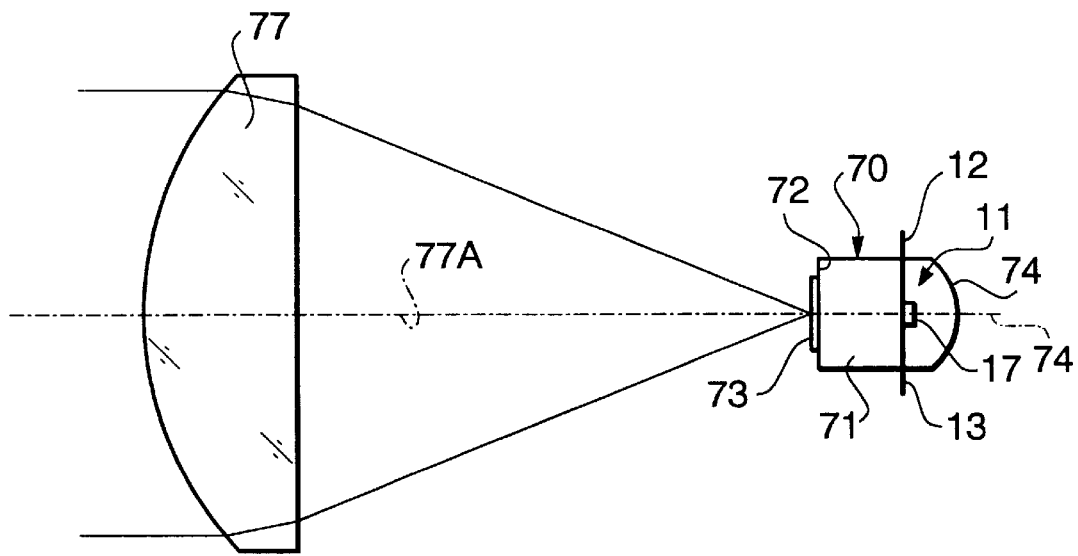
FIG. 7 is a cross sectional view of an LED unit according to a sixth embodiment of the invention.

FIG. 7 is a cross sectional view of an LED unit 70 according to a sixth embodiment of the invention.

As shown in FIG. 7, the LED unit 70 has an acrylic resin body 71 in which an LED chip 11 is enclosed. A surface 74 of the acrylic resin 71 facing a light emitting surface of the LED unit 11 is formed to be a reflection surface 74. On the reflection surface 74, coating of aluminum or the like is formed by evaporation. A surface located opposite to the reflection surface 74 is a light emerging surface 72 through which a light beam is emerged. The reflection surface 74 is formed as a concave surface, and the emerging surface 72 is a planar surface. On the emerging surface 72, a pattern 73 having a plurality of slits is provided. The pattern 73 and the light emitting surface 17 of the LED unit 11 are conjugate with respect to the reflection surface 74. Further, in front of the pattern 73, a projection lens 77 for forming an image of the comb-like slit pattern at a predetermined position.

In the LED unit 70 shown in FIG. 7, an optical axis 74A of the reflection surface 74 and the normal at the center of the emerging surface 72 coincide with each other. Further, an optical axis 77A of the projection lens 77, the optical axis 74A, and the central ray of the light beam emitted by the LED chip 11 coincide with each other. The light beam emitted from the emerging surface 73 is reflected by the reflection surface 74 and is emerged from the surface 72. Since the emerging surface 72 and the light emitting surface 17 of the LED chip 11 are conjugate with respect to the reflection surface 74, an image of the comb-like pattern is formed as if light is emitted from the pattern 73.

Thus, the image of the pattern 73 is formed at a predetermined position in front of the projection lens 77. Even if an object has a relatively low contrast, the image of the pattern 73 is formed on the object, and accordingly by receiving the light reflected by the object, it becomes possible to adjust the focusing state.

In FIG. 7, 12 and 13 denote lead lines for supplying power to the LED chip 11. The lead lines 12 and 13 extend in parallel with the emerging surface 72. With this structure, the LED unit 70 can easily be formed with molding process since the terminals 12 and 13 can be arranged along the parting-line (PL) surface of the mold.

Figure 11:
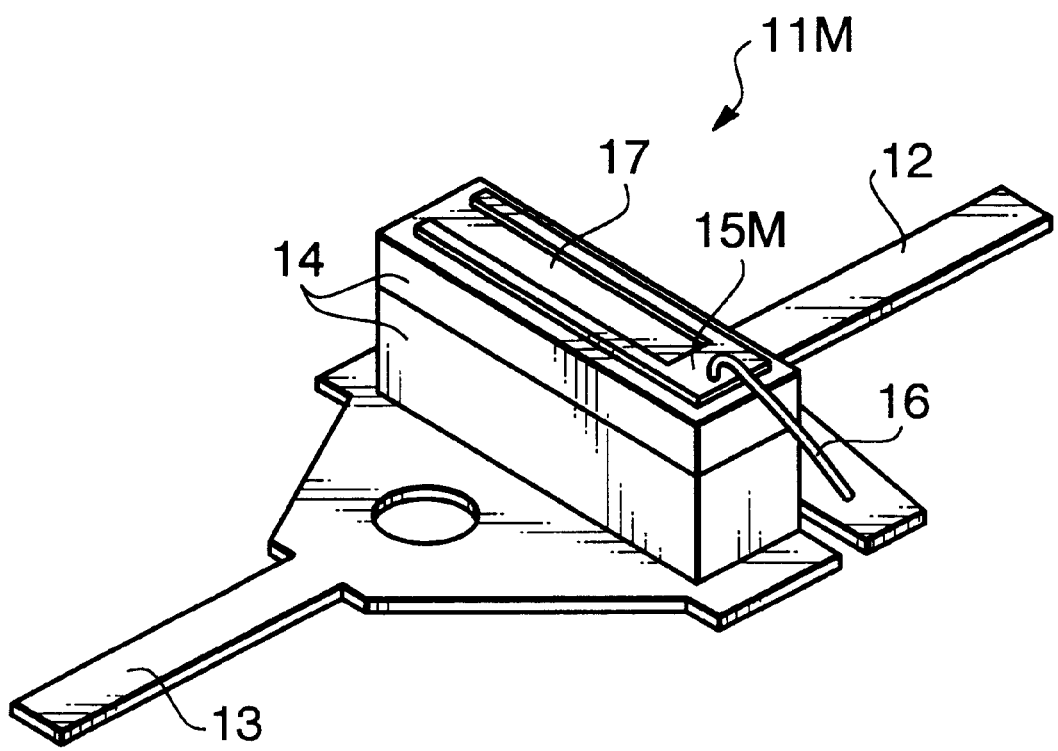
FIG. 11 is a perspective view of the LED chip employed in the sixth and seventh embodiments.

FIG. 11 is a perspective view of the LED chip 11M enclosed in the LED unit 70. The LED chip 11M is similar to the LED chip 11 shown in FIG. 6 except that an electrode 15M is not formed to have comb-like pattern to be projected. As described above, in the sixth embodiment, the pattern 73 is provided on the emerging surface 72, and accordingly, a pattern is not provided on the light emitting surface 17 of the PN semiconductor 14.

[Seventh Embodiment]

Figure 8:
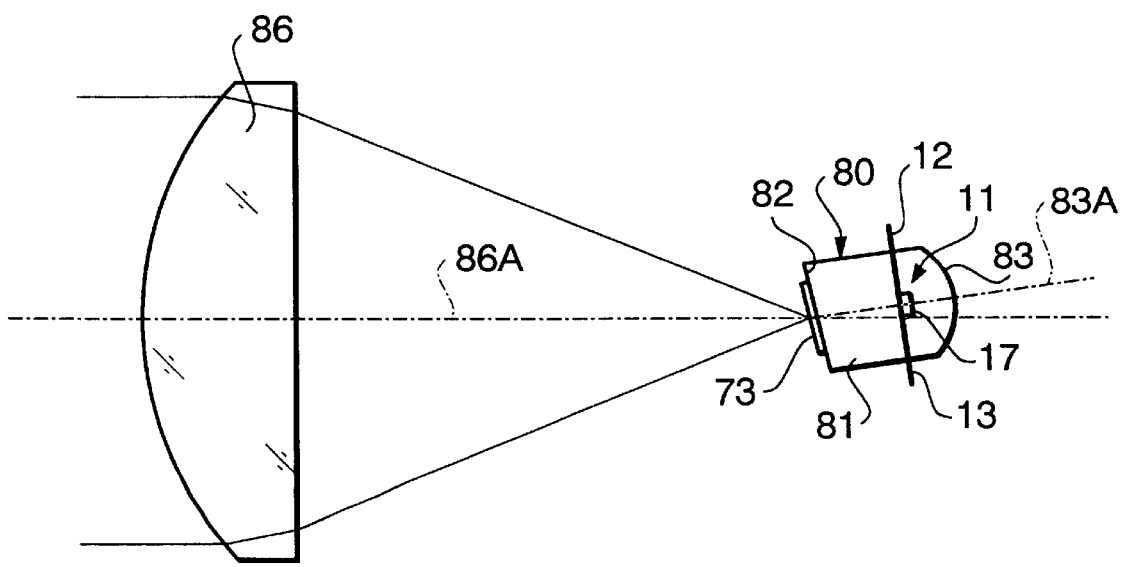
FIG. 8 is a cross sectional view of an LED unit according to a seventh embodiment of the invention.
Figure 9:
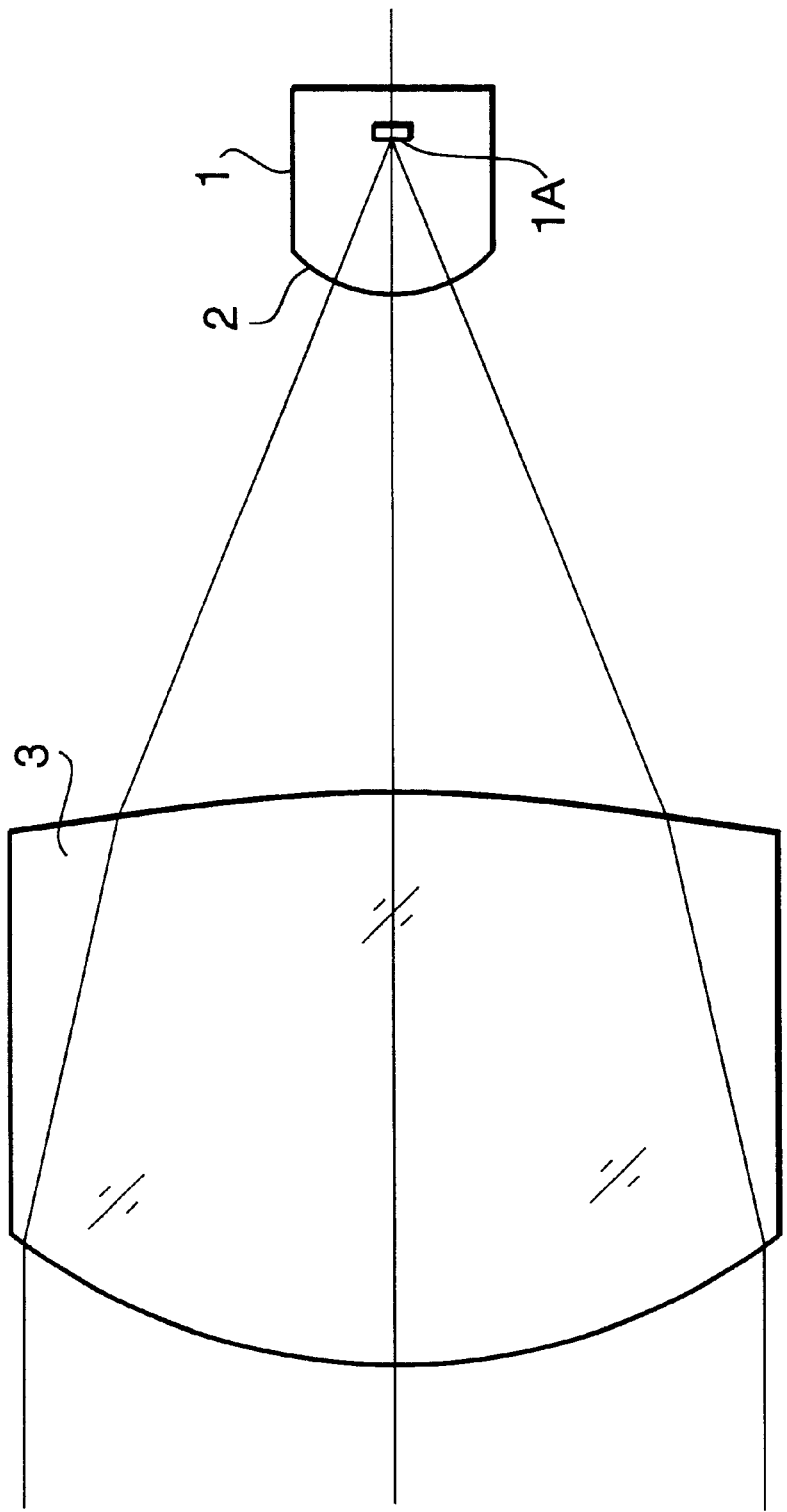
FIG. 9 is a diagram showing an example of a conventional LED unit.
Figure 10:
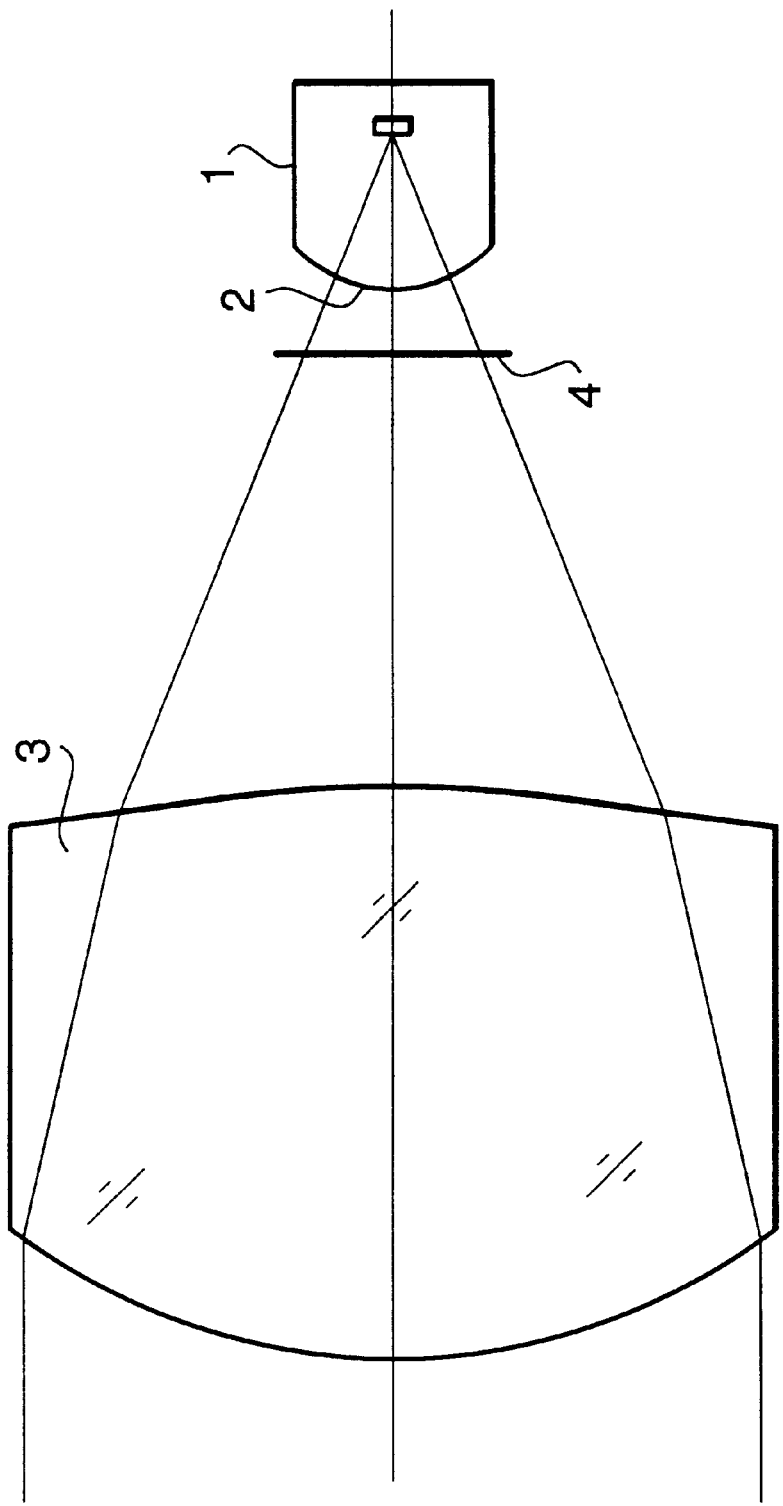
FIG. 10 is a diagram showing another example of conventional LED unit.

FIG. 8 is a cross sectional view of an LED unit 80 according to a seventh embodiment of the invention.

The LED unit 80 is constituted such that an acrylic resin body 81 has a planar light emerging surf ace 82, and a concave reflection surface 83 which is an opposing surface of the emerging surface 82 and is formed with aluminum evaporation. As shown in FIG. 8, the emerging surface 82 inclines with respect to a plane perpendicular to an optical axis 83A of the reflection surface 83. It should be noted that, in this embodiment, the optical axis 83A is defined as a normal to the reflection surface 83 at the center thereof. On the emerging surface 82, a comb-like pattern 73 is adhered. The plane on which the pattern 73 is located and the light emitting surface of an LED chip 11 are conjugate with respect to the reflection surface 83. In front of the emerging surface 82, a light projection lens 86 is arranged.

As described above, the emerging surface 82 inclines with respect to an optical axis 86A of the projection lens 86. The inclination is determined in accordance with the Scheimpflug rule so that the image of the pattern 73 is projected over a relatively wide distance range. Further, the emerging surface 82 is also inclined with respect to a plane perpendicular to a principle ray of a light beam emitted by the LED chip 11 so that the light beam emitted by the LED chip 11 is refracted on the emerging surface 82 and proceeds along the optical axis 86A of the projection lens 86. With above constitution, the image of the chart 73 is formed on a wide area within a predetermined distance range. Further, the light beam emitted by the LED 80 can be utilized efficiently. Thus, the measurable distance can be elongated.

According to the above structure, distance measurement can be performed over a relatively wide range, when the phase difference method is used.

In the above embodiments, the LED unit is explained as used in the auto-focusing device of a camera. Application of the LED unit to cameras are well known, and examples of such a camera can be found in U.S. Pat. No. 5,870,637 and U.S. Pat. No. 5,065,177. One skilled in the art can replace an LED unit employed in a conventional camera with one according to the present invention, without any difficulty.

Further, the LED unit according to the invention is not limited to application to the camera, but can be applied to video cameras, image capturing devices for medical use or measurement, and the like.

The present disclosure relates to the subject matters contained in Japanese Patent Applications Nos. HEI 10-111807 and HEI 10-111965, both filed on Apr. 22, 1998, which are expressly incorporated herein by reference in their entireties.

What is claimed is:

1. A light emitting diode (LED) unit, comprising:
   an LED chip having a light emitting surface; and
   a transparent body enclosing said LED chip, said transparent body having:

a reflection surface that is arranged to face said light emitting surface to reflect a light beam emitted by said LED chip; and a light emerging surface that is a surface opposite to said reflection surface, wherein the light beam emitted from said light emitting surface of said LED chip is reflected by said reflection surface, and then emerged from said light emerging surface, and wherein at least one of said reflection surface and said light emerging surface is formed to have a positive power so that a converging light beam is emerged from said light emerging surface.

2. The LED unit according to claim 1, wherein said reflection surface includes a concave reflection surface.

3. The LED unit according to claim 1, wherein said light emerging surface includes a convex surface.

4. The LED unit according to claim 1, wherein said reflection surface includes a concave reflection surface, and wherein said light emerging surface includes a convex surface.

5. A light emitting diode (LED) unit, comprising:

an LED chip having a light emitting surface; and a transparent body enclosing said LED chip, said transparent body having:

a reflection surface that is arranged to face said light emitting surface to reflect a light beam emitted by said LED chip; and a light emerging surface that is a surface opposite to said reflection surface, the light beam emitted from said light emitting surface of said LED chip being reflected by said reflection surface and then emerged from said light emerging surface; and a chart having a predetermined pattern, the light beam emerged from said light emerging surface forming an image of said predetermined pattern.

6. The LED unit according to claim 5, wherein said chart is provided on said light emitting surface of said LED chip.

7. The LED unit according to claim 6, wherein said chart includes an electrode attached on the light emitting surface of said LED chip.

8. The LED unit according to claim 5, wherein at least one of said reflection surface and said light emerging surface being formed to have a positive power.

9. The LED unit according to claim 8, wherein said reflection surface includes a concave reflection surface, and wherein a normal to said light emitting surface of said LED chip is inclined with respect to a plane perpendicular to an optical axis of said concave reflection surface.

10. The LED unit according to claim 8, wherein said light emerging surface includes a convex surface, and wherein a normal to said light emitting surface of said LED chip is inclined with respect to a plane perpendicular to an optical axis of said convex surface.

11. The LED unit according to claim 5, wherein said chart having the predetermined pattern is arranged in the vicinity of said light emerging surface, and wherein said LED unit further comprises a projection lens for forming an image of said predetermined pattern.

12. The LED unit according to claim 11, wherein said reflection surface comprises a concave reflection surface.

13. The LED unit according to claim 12, wherein said chart and said light emitting surface of said LED chip are conjugate with respect to said concave reflection surface.

14. The LED unit according to claim 11, wherein said light emerging surface and said chart incline with respect to a plane perpendicular to an optical axis of said projection lens.

15. The LED unit according to claim 14, wherein the light beam emerged from said light emerging surface proceeds along said optical axis of said projection lens.

* * * * *